US007408013B2

(12) United States Patent
Feiring et al.

(10) Patent No.: US 7,408,013 B2
(45) Date of Patent: Aug. 5, 2008

(54) LOW-POLYDISPERSITY PHOTOIMAGEABLE POLYMERS AND PHOTORESISTS AND PROCESSES FOR MICROLITHOGRAPHY

(75) Inventors: Andrew Edward Feiring, Wilmington, DE (US); Michael Fryd, Wilmington, DE (US); Frank Leonard Schadt, III, Wilmington, DE (US)

(73) Assignee: Commonwealth Scientific and Industrial Research Organization, Campbell (AT)

( * ) Notice: Subject to any disclaimer, the term of this patent is extended or adjusted under 35 U.S.C. 154(b) by 329 days.

(21) Appl. No.: 10/945,124

(22) Filed: Sep. 20, 2004

(65) Prior Publication Data

US 2005/0112495 A1    May 26, 2005

Related U.S. Application Data

(60) Provisional application No. 60/505,077, filed on Sep. 23, 2003.

(51) Int. Cl.
*C08F 20/06* (2006.01)
*C08F 20/10* (2006.01)
(52) U.S. Cl. .................... 526/317.1; 526/318; 526/280; 526/281
(58) Field of Classification Search ............. 526/317.1, 526/318, 280, 281
See application file for complete search history.

(56) References Cited

U.S. PATENT DOCUMENTS

| 3,444,148 | A | | 5/1969 | Adelman | |
|---|---|---|---|---|---|
| 5,109,088 | A | * | 4/1992 | Ohwada et al. | 526/273 |
| 5,585,222 | A | * | 12/1996 | Kaimoto et al. | 430/296 |
| 6,303,724 | B1 | * | 10/2001 | Goodall et al. | 526/266 |
| 6,441,115 | B1 | | 8/2002 | Chang et al. | |
| 6,790,587 | B1 | * | 9/2004 | Feiring et al. | 430/270.1 |

FOREIGN PATENT DOCUMENTS

| EP | 0 990 666 A1 | 4/2000 |
|---|---|---|
| EP | 0 910 587 B1 | 12/2001 |
| JP | 62186907 A2 | 8/1987 |
| WO | WO 98/01478 | 1/1998 |
| WO | WO 99/31144 | 6/1999 |
| WO | WO 00/66575 | 11/2000 |
| WO | WO 00/67072 | 11/2000 |

OTHER PUBLICATIONS

T.Y Lee et al., Advances in Resist Technology and Processing XX, Theodore H. Fedynyshyn, Editor, Proceedings of SPIE, vol. 5039:548-557, 2003.
Moad and Solomon, The Chemistry of Free Radical Polymerization, Pergamon, London, pp. 53-95:1995.

* cited by examiner

*Primary Examiner*—Ling-Sui Choi
(74) *Attorney, Agent, or Firm*—Arent Fox LLP

(57) ABSTRACT

The invention pertains to low polydispersity copolymers useful for photoimaging and photoresist compositions, and to the photoimaging processes which use these compositions. The low polydispersity copolymers of this invention are prepared using controlled radical polymerization (CRP) techniques, such as RAFT (reversible addition fragmentation chain transfer) polymerization.

33 Claims, No Drawings

US 7,408,013 B2

LOW-POLYDISPERSITY PHOTOIMAGEABLE POLYMERS AND PHOTORESISTS AND PROCESSES FOR MICROLITHOGRAPHY

BACKGROUND OF THE INVENTION

1. Field of the Invention

The present invention pertains to low-polydispersity copolymers useful for photoimaging and photoresist compositions, and to the photoimaging processes which use these compositions. The low-polydispersity copolymers of this invention are prepared using controlled radical polymerization (CRP) techniques such as RAFT (reversible addition fragmentation chain transfer) polymerization.

2. Description of Related Art

Polymer products are used as components of imaging and photosensitive systems and particularly in photoimaging systems. In such systems, ultraviolet (UV) light or other electromagnetic radiation impinges on a material containing a photoactive component to induce a physical or chemical change in that material. A useful or latent image is thereby produced which can be processed into a useful image for semiconductor device fabrication.

For imaging features at the submicron level in semiconductor devices, electromagnetic radiation in the far or extreme ultraviolet (UV) is needed. Photolithography at 248 nm exposure is currently in commercial use, and 193 nm exposure is currently being introduced for microelectronics fabrication using design rules for 0.13 μm and below. Photolithography using 157 nm exposure may be needed for 0.07 μm or lower design rules.

Photoresists comprising copolymers with fluoroalcohol functional groups have been disclosed in WO 00/67072.

Copolymers of fluorinated alcohol monomers with other comonomers have been reported (U.S. Pat. No. 3,444,148 and JP 62186907 A2). These patents are directed to membrane or other non-photosensitive films or fibers, and do not teach the use of fluorinated alcohol comonomers in photosensitive layers (e.g., resists).

There is also increasing interest in developing polymerization processes that can be predictably controlled to produce polymers having a specifically desired architecture and molecular weight. One of the means for achieving such results is through a process of "living polymerization." Such a process provides a higher degree of control during the synthesis of polymers having predictably well-defined architecture and molecular weight with narrow dispersity as compared to polymers made by conventional polymerization processes.

RAFT (reversible addition fragmentation chain transfer) polymerization processes have been disclosed for the preparation of low-polydispersity polymers from acrylic, styrenic and selected other vinyl monomers. (WO 98/01478, WO 99/31144 and EP 0 910,587). Fields of application for these RAFT-derived polymers include imaging and electronics (e.g., photoresists).

T.-Y Lee et al., (Advances in Resist Technology and Processing XX, Theodore H. Fedynyshyn, Editor, Proceedings of SPIE, Vol. 5039 (2003), pp 548-557) have disclosed the preparation of acrylate terpolymers using RAFT processes. They also disclose the use of controlled radical polymerization (CRP) processes for the copolymerization of fluorinated norbornenes with norbornene, and the copolymerization of norbornenes with acrylates to be used in 157 nm photoresists. Yields of the polymers are low, and molecular weights are very low (Mn<3700) in all but one example.

There remains a need for photoresists with high transparency at 157-248 nm and good resolution to enable the production of electronic components with smaller and smaller feature sizes.

SUMMARY OF THE INVENTION

This invention provides a low polydispersity copolymer comprising:
 a. a repeat unit derived from an acrylic monomer;
 b. a repeat unit derived from an unsaturated polycyclic monomer;
 c. a functional group selected from the group of fluoroalcohol, protected fluoroalcohol group and protected acid group; and, optionally,
 d. a repeat unit derived from a fluoro-olefin,
 wherein at least 40 mole % of the repeat units of the low polydispersity copolymer are derived from acrylic monomers.

In a second aspect, this invention also provides a photoresist comprising:
 a. a photoactive component; and
 b. a low polydispersity copolymer comprising:
  i. a repeat unit derived from an acrylic monomer;
  ii. a repeat unit derived from an unsaturated polycyclic monomer;
  iii. a functional group selected from the group of fluoroalcohol, protected fluoroalcohol group and protected acid group; and, optionally,
  iv. a repeat unit derived from a fluoro-olefin,
  wherein at least 40 mole % of the repeat units of the low polydispersity copolymer are derived from acrylic monomers.

In a third aspect, this invention provides a process for forming a coated substrate, comprising:
 A. coating a substrate with a mixture comprising:
  1. a low-polydispersity copolymer comprising:
   a. a repeat unit derived from an acrylic monomer;
   b. a repeat unit derived from an unsaturated polycyclic monomer;
   c. a functional group selected from the group of fluoroalcohol, protected fluoroalcohol group and protected acid group; and, optionally
   d. a repeat unit derived from a fluoro-olefin, wherein at least 40 mole % of the repeat units of the low polydispersity copolymer are derived from acrylic monomers;
  2. a photoactive component; and
  3. a solvent; and
 B. evaporating the solvent.

In a fourth aspect, this invention provides a process for forming a photoresist image on a substrate, comprising
 a. forming a photoresist layer on a substrate, wherein the photoresist comprises a low-polydispersity copolymer of this invention and a photoactive component;
 b. imagewise exposing the photoresist layer to actinic radiation to form imaged and non-imaged areas; and
 c. developing the exposed photoresist layer having imaged and non-imaged areas to form the photoresist image on the substrate.

This invention also provides coated and/or imaged substrates, produced by the coating and imaging processes of this invention.

The present invention also provides a process for producing a low polydispersity polymer, comprising polymerizing a monomer mix comprising at least one acrylic monomer, at least one unsaturated polycyclic monomer and optionally one or more fluoro-olefins, wherein at least one monomer contains a fluoroalcohol, a protected fluoroalcohol, or a protected acid group, in the presence of a source of free radicals and a chain transfer agent to produce a copolymer containing at least 40 mole % repeat units derived from acrylic monomers, wherein the chain transfer agent has a transfer constant in the range of from 0.1 to 500 and the chain transfer agent has the following structure:

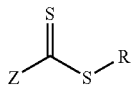

wherein:
R=alkyl, alkenyl, aryl, aralkyl, substituted alkyl, substituted aryl, carbocyclic or heterocyclic ring, alkylthio, alkoxy, or dialkylamino; and
Z=H, alkyl, aryl, aralkyl, substituted alkyl, substituted aryl, carbocyclic or heterocyclic ring, alkylthio, arylthio, alkoxycarbonyl, aryloxycarbonyl, carboxy, acyloxy, carbamoyl, cyano, dialkyl- or diaryl-phosphonato, or dialkyl- or diaryl-phosphinato.

The present invention is also directed to polymers made by the polymerization process of the current invention.

DETAILED DESCRIPTION OF THE INVENTION

In the context of the present invention, low polydispersity polymers are those with polydispersities that are significantly less than those produced by conventional free radical polymerization. In conventional free radical polymerization, polydispersities of the polymers formed are typically in the range of 1.5-2.0 at low monomer conversions (i.e., 0.1% to 10% conversion) and are substantially greater (in the range of 2-10) at higher conversions (i.e.,10-100% conversion). Polymers having poly-dispersity in the range of 1.05 to 2.0 at conversions of greater than 10% are preferred; poly-dispersities of 1.05 to 1.3 at high conversion are more preferred.

One of the advantages of the present polymerization system is that by controlling the reaction stoichiometry and the degree of conversion of the monomers into polymer the process produces polymers of predetermined molecular weight and narrow molecular weight distribution over a wide range of monomers and reaction conditions.

Fluoro-Olefin Comonomers

The low-dispersity copolymers of this invention optionally comprise at least one repeat unit derived from a fluoro-olefin. Suitable fluoro-olefins comprise 2 to 20 carbon atoms and contain at least one fluorine atom attached to an ethylenically unsaturated carbon. Representative fluoro-olefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2=CFO(CF_2)_t CF=CF_2$, where t is 1 or 2, and $R_f''OCF=CF_2$ wherein $R_f''$ is a fluoroalkyl group of from 1 to 10 carbon atoms. A preferred fluoroolefin is tetrafluoroethylene.

Polycyclic Comonomers

A copolymer of this invention comprises a repeat unit derived from at least one polycyclic ethylenically unsaturated compound. The polycyclic compound contains at least one ethylenically unsaturated carbocyclic or heterocyclic ring that is capable of being incorporated (via polymerization) into the copolymer, as illustrated below.

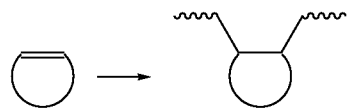

The polycyclic unsaturated compound optionally contains a functional group derived from a fluoroalcohol, a protected fluoroalcohol, or a protected acid functional group. This fluoroalcohol groups contains fluoroalkyl groups, designated $R_f$ and $R_f'$, which can be partially or fully fluorinated alkyl groups. $R_f$ and $R_f'$ are the same or different fluoroalkyl groups of from 1 to 10 carbon atoms or taken together are $(CF_2)_n$ wherein n is 2 to 10. The phrase "taken together" indicates that $R_f$ and $R_f'$ are not separate, discrete fluorinated alkyl groups, but that together they form a ring structure such as is illustrated below in case of a 5-membered ring:

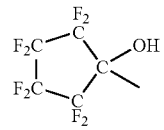

$R_f$ and $R_f'$ must be sufficiently fluorinated to impart acidity to the hydroxyl (—OH) of the corresponding fluoroalcohol functional group, such that the hydroxyl proton can be substantially removed in basic media (e.g., aqueous sodium hydroxide or tetraalkylammonium hydroxide solution). Preferably, there is sufficient fluorine in the fluoroalcohol functional group such that the hydroxyl group has a pKa value of 5-11. Preferably, $R_f$ and $R_f'$ are independently perfluoroalkyl groups of 1 to 5 carbon atoms, most preferably, trifluoromethyl ($CF_3$). The number of fluoroalcohol groups is determined for a given composition by optimizing the amount needed for good development in aqueous alkaline developer.

Preferably, the low polydispersity copolymers comprise a repeat unit derived from at least one ethylenically unsaturated polycyclic compound containing a fluoroalcohol functional group having the structure:

$$-X_r(CH_2)_qC(R_f)(R_f')OH$$

wherein $R_f$ and $R_f'$ are the same or different fluoroalkyl groups of from 1 to 10 carbon atoms, or taken together are $(CF_2)_n$; n is an integer from 2 to 10; X is selected from the group consisting of S, O, N, and P; q=0 and r=0; or q=1 and r=0 or 1. Preferably, r=0. When r=1, preferably X is O (oxygen).

Some illustrative, but nonlimiting, examples of representative polycyclic comonomers containing a fluoroalcohol functional group that are within the scope of the invention are presented below:

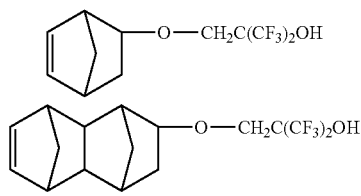

-continued

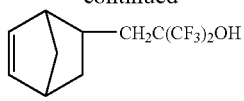

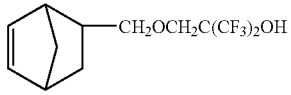

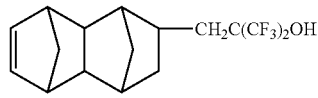

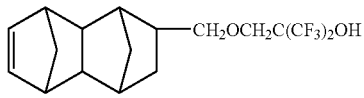

In a preferred embodiment, the polycyclic fluorinated alcohol is a fluorinated alcohol substituted norbornene, particularly hexafluoroisopropanol substituted norbornene. NB—F—OH is a most preferred polycyclic fluoroalcohol.

Acrylic Monomer

The low-polydispersity copolymer further comprises a repeat unit derived from an acrylic monomer, $CH_2$=$CR'CO_2R''$ or $CH_2$=$C(CH_2OH)CO_2R'''$.

When the acrylic monomer is $CH_2$=$C(CH_2OH)CO_2R'''$, $R'''$ is a $C_1$-$C_{25}$ alkyl group, optionally substituted by one or more hydroxy, halogen, ether oxygen, ester or ketone carbonyl groups. Preferably $R'''$ contains 1 to 20 carbon atoms. A preferred alkyl group, $R'''$, is one that is acid-labile. Examples of acid-labile alkyl groups include, but are not limited to, tertiary alkyl groups such as tertiary butyl and 2-methyl-2-adamantyl, and α-substituted cyclic ethers such as 2-tetrahydropyranyl and 2-tetrahydrofuranyl. The most preferred repeat unit derived from an alkyl-substituted hydroxymethylacrylate comonomer is tert-butyl hydroxymethylacrylate, $CH_2$=$C(CH_2OH)CO_2{}^tBu$.

When the acrylic monomer is $CH_2$=$CR'CO_2R''$, $R'$ is H, F, an alkyl group of 1 to 5 carbon atoms, or a fluoroalkyl group of 1 to 5 carbon atoms. $R''$ is a $C_1$-$C_{20}$ acyclic aliphatic group; or a cyclic $C_5$-$C_{50}$ or a polycyclic $C_7$-$C_{50}$ alkyl group, optionally containing at least one hydroxy functional group or a functional group of the formula —$C(R^1)(R^2)$—$[C(R^3)(R^4)]_m$—$C(R^5)(R^6)$—OH. Preferably $R'$ is H.

When the acrylic monomer is $CH_2$=$CR'CO_2R''$, a preferred embodiment is when $R''$ is a polycyclic group containing from 5 to 50 carbon atoms, preferably 5 to 30 carbon atoms, with at least one hydroxyl substituent. $R''$ can also be optionally substituted by one or more halogen, ether oxygen, ester or ketone carbonyl groups. Preferred polycyclic acrylic monomers include hydroxyadamantyl acrylate ($CH_2$=$CHCO_2R''$, wherein $R''$ is hydroxyadamantyl) and 2-methyl-2-adamantyl acrylate. $R''$ can have one or more fluorine substituents.

Alternatively, $R''$ can be a functional group of the formula:

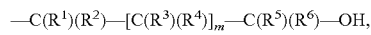

wherein
m=0, 1, 2, 3, 4 or 5;
$R^1$ and $R^2$ are independently $C_1$-$C_6$ alkyl, or $C_1$-$C_6$ alkyl substituted with an ether oxygen, or $R^1$ and $R^2$ taken together form a 3- to 8-membered ring, optionally substituted with an ether oxygen, provided that the carbon attached to $R^1$ and $R^2$ is not at a bridgehead position;
$R^3$ and $R^4$ are independently H, $C_1$-$C_6$ alkyl, or $C_1$-$C_6$ alkyl substituted with an ether oxygen, or $R^3$ and $R^4$ taken together form a 3- to 8-membered ring, optionally substituted with an ether oxygen;
$R^5$ and $R^6$ are independently H, $C_1$-$C_6$ alkyl, or $C_1$-$C_6$ alkyl substituted with an ether oxygen, or $R^5$ and $R^6$ taken together form a 3- to 8-membered ring, optionally substituted with an ether oxygen; or
$R^1$ and $R^5$ taken together with —$[C(R^3)(R^4)]_m$— form a 4- to 8-membered ring, provided that the carbon attached to $R^1$ and $R^2$ is not at a bridgehead position.

PinAc (2-propenoic acid, 2-hydroxy-1,1,2-trimethylpropyl ester) and the methacrylate analog, PinMAc, are preferred acyclic acrylic monomers.

The low-polydispersity polymer also comprises a repeat unit derived from a cyclic or polycyclic unsaturated compound, including, but not limited to compounds such as those represented by structures (H) and (I),

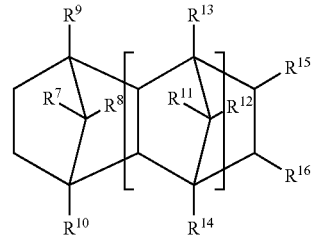

(H)

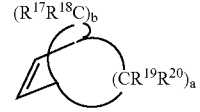

(I)

wherein:
s is 0, 1 or 2;
a and b are independently 1, 2 or 3, except that a is not 1 when b is 2 and b is not 1 when a is 2; and
$R^7$ to $R^{16}$ and $R^{17}$ to $R^{20}$ are the same or different and each represents a hydrogen atom, a halogen atom, a carboxyl group, a $C_3$ to $C_{14}$ secondary or tertiary alkyl carboxylate, a hydrocarbon group or a substituted hydrocarbon group.

Representative comonomers having structure H include, but are not limited to:

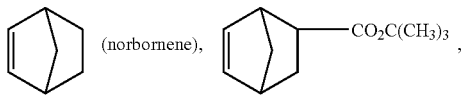

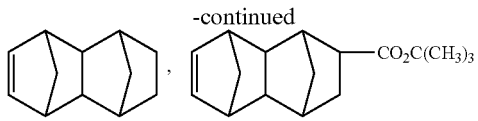

Representative comonomers having structure I include, but are not limited to:

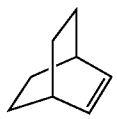 (bicyclo[2.2.2.]oct-2-ene), 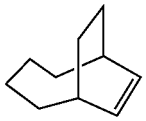

Other suitable monomers include ethylenically unsaturated cyclic compounds having the structure I or II. Structure I is further defined in that

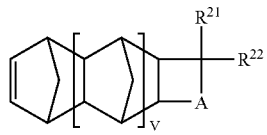  (I)

v is 0, 1, or 2;
A is O (oxygen) or $NR^{27}$;
$R^{27}$ is selected from the group of H; $C_1$-$C_{10}$ alkyl or alkoxy, optionally substituted by halogen or ether oxygens; $C_6$-$C_{20}$ aryl; Y; $C(R_f)(R_f')OR^{28}$; $R^{29}Y$; and $OR^{29}Y$;
$R^{28}$ is a $C_1$-$C_{10}$ alkyl group;
$R^{29}$ is a $C_1$-$C_{20}$ alkylene group, optionally substituted by halogen or ether oxygen;
Y is COZ' or $SO_2Z'$;
Z' is OH, halogen, $R^{30}$ or $OR^{30}$;
$R^{30}$ is a $C_1$-$C_{20}$ alkyl group, optionally substituted by halogen or ether oxygens; or $C_6$-$C_{20}$ aryl;
$R_f$ and $R_f'$ are the same or different fluoroalkyl groups of 1 to 10 carbon atoms or taken together are $(CF_2)_n$ where n is 2 to 10; and
$R^{21}$ and $R^{22}$ are independently selected from the group of H; halogen; $C_1$-$C_{10}$ alkyl or alkoxy, optionally substituted by halogen or ether oxygen; $C_6$-$C_{20}$ aryl; Y; $C(R_f)(R_f')OR^{28}$; $R^{29}Y$; and $OR^{29}Y$; or
$R^{21}$ and $R^{22}$ taken together are $=C(R_f)(R_f')$ or $C_2$-$C_9$ alkylene, optionally substituted by halogen or incorporating an ether oxygen.

Structure II is further defined in as much as

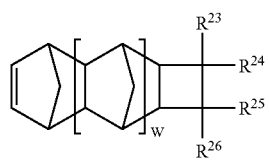  (II)

w is 0, 1, or 2;
$R^{23}$, $R^{24}$ and $R^{25}$ are independently selected from the group of H; halogen; $C_1$-$C_{10}$ alkyl or alkoxy, optionally substituted by halogen or ether oxygen; $C_6$-$C_{20}$ aryl; Y; $C(R_f)(R_f')OR^{28}$; $R^{29}Y$; and $OR^{29}Y$; or
$R^{24}$ and $R^{25}$ taken together are part of a double bond;
$R^{26}$ is hydrogen or an acid-labile protecting group;
$R^{28}$ is a $C_1$-$C_{10}$ alkyl group;
$R^{29}$ is a $C_1$-$C_{20}$ alkylene group, optionally substituted by halogen or ether oxygen;
Y is COZ' or $SO_2Z'$;
Z' is OH, halogen, $R^{30}$ or $OR^{30}$;
$R^{30}$ is a $C_1$-$C_{20}$ alkyl group, optionally substituted by halogen or ether oxygens; or $C_6$-$C_{20}$ aryl; and
$R_f$ and $R_f'$ are the same or different fluoroalkyl groups of 1 to 10 carbon atoms or taken together are $(CF_2)_n$ where n is 2 to 10.

Bifunctional compounds that can initially provide crosslinking and subsequently can be cleaved (e.g., upon exposure to strong acid) are also useful as comonomers in the copolymers of this invention. Photoresist compositions, incorporating copolymers comprising these bifunctional monomers, can have improved development and imaging characteristics, since exposure to light photochemically generates strong acid or base, which cleaves the bifunctional group. This results in a very significant drop in molecular weight, which can lead to greatly improved development and imaging characteristics (e.g., improved contrast).

RAFT Polymerization Process

We have discovered a novel free radical polymerization process and novel polymers produced therefrom. The process is directed to polymerizing a monomer mix in the presence of a source of free radicals and at least one of certain sulfur-based chain transfer agents (CTAs), chosen so as to confer living characteristics. By utilizing these CTAs, polymers of controlled molecular weight and low polydispersity can be obtained.

The sulfur-based CTAs suitable for use in the present invention have a chain transfer constant in the range of from 0.1 to 5000, preferably in the range of from 1 to 2000, and more preferably in the range of from 10 to 500. If the chain transfer constant of the CTA exceeds the upper limit of the range, substantially no polymerization occurs; if it falls below the lower limit, it is not possible to produce polymers having low polydispersity.

"Chain transfer constant" means the ratio of the rate constant for chain transfer to the rate constant for propagation at zero conversion of monomer and CTA. If chain transfer occurs by addition-fragmentation, the rate constant for chain transfer ($k_{tr}$) is defined as follows:

$$k_{tr} = k_{add} \times \frac{k_\beta}{k_{-add} + k_\beta}$$

where $k_{add}$ is the rate constant for addition to the CTA and $k_{-add}$ and $k_\beta$ are the rate constants for fragmentation in the reverse and forward directions respectively.

Suitable chain transfer agents have the following formula:

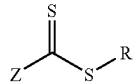

wherein:

R=alkyl, alkenyl, aryl, substituted alkyl, substituted aryl, aralkyl, carbocyclic or heterocyclic ring, alkylthio, alkoxy, or dialkylamino; and Z=H, alkyl, aryl, aralkyl, substituted alkyl, substituted aryl, carbocyclic or heterocyclic ring, alkylthio, arylthio, alkoxycarbonyl, aryloxycarbonyl, carboxy, acyloxy, carbamoyl, cyano, dialkyl- or diaryl-phosphonato, or dialkyl- or diaryl-phosphinato.

The preparation of examples of suitable CTAs is disclosed in U.S. Pat. No. 6,512,081, WO 98/01478, WO 99/31144, EP 0 825,247 and EP 0 910,587, which are hereby incorporated by reference. Suitable CTAs include dithioesters, thiocarbonylthio compounds, benzyl (1,2-benzenedicarboximido)carbodithioate, 2-cyanoprop-2-yl 1-pyrrolecarbo-dithioate, 2-cyanobut-2-yl 1-pyrrolecarbodithioate, benzyl 1-imidazolecarbodithiolate, xanthate derivatives such as O-ethyl S-(1-phenylethyl)xanthate, O-ethyl S-(2-ethoxycarbonylprop-2-yl) xanthate, and O-ethyl S-(2-cyanoisopropyl)xanthate. Preferred CTAs include dithioesters and trithiocarbonates, especially S-cyanomethyl-S-dodecyltrithiocarbonate and 4-cyano-4-(dodecylsulfanylthiocarbonyl)sulfanyl pentanoic acid.

The source of free radicals suitable for use in the present invention includes those compounds that provide free radicals that add to monomers to produce propagating radicals. Propagating radicals are radical species that have added one or more monomer units and are capable of adding further monomer units.

The amount of the free radical initiator used should be chosen to keep the free radical concentration low. The molar ratio of free radical initiator to the RAFT chain transfer agent should be about 0.05-10, preferably 0.1-2, and most preferably 0.2-1.

It should be noted that the molecular weight of the copolymer is determined by the molar ratio of RAFT chain transfer agent to monomer. In principle, each polymer chain will have a RAFT end group, so the number of RAFT molecules will determine the number of copolymer chains, and hence the molecular weight.

The source of initiating radicals can be any suitable method of generating free radicals that provides free radicals that add to monomers to produce propagating radicals. This includes such sources as the thermally induced homolytic scission of a suitable compound(s) (such as peroxides, peroxyesters, hydroperoxides, persulfates, perborates, or azo compounds), the spontaneous generation from monomer, redox initiating systems, photochemical initiating systems or high energy radiation such as electron beam, X- or y-radiation. The initiating system is chosen such that under the reaction conditions there is no substantial adverse interaction of the initiator or the initiating radicals with the transfer agent under the conditions of the experiment. The initiator should also have the requisite solubility in the reaction medium or monomer mixture.

Examples of suitable sources of free radicals for the process include azo compounds and peroxides such as: 2,2'-azobis(isobutyronitrile), 2,2'-azobis(2-cyano-2-butane), dimethyl 2,2'-azobis(methyl isobutyrate), 4,4'-azobis(4-cyanopentanoic acid), 4,4'-azobis(4-cyanopentan-1-ol), 1,1'-azobis(cyclohexanecarbonitrile), 2-(t-butylazo)-2-cyanopropane, 2,2'-azobis[2-methyl-N-(1,1)-bis(hydroxymethyl)-2-hydroxyethyl]propionamide, 2,2'-azobis[2-methyl-N-hydroxyethyl)]-propionamide, 2,2'-azobis(N,N'-dimethyleneisobutyramidine)dihydrochloride, 2,2'-azobis(2-amidinopropane)dihydrochloride, 2,2'-azobis-(N,N'-dimethyleneisobutyramine), 2,2'-azobis(2-methyl-N-[1,1-bis(hydroxymethyl)-2-hydroxyethyl]propionamide), 2,2'-azobis(2-methyl-N-[1,1-bis(hydroxymethyl)ethyl] propionamide), 2,2'-azobis[2-methyl-N-(2-hydroxyethyl) propionamide], 2,2'-azobis(isobutyramide) dihydrate, 2,2'-azobis(2,2,4-trimethylpentane), 2,2'-azobis(2-methylpropane), t-butyl peroxyacetate, t-butyl peroxybenzoate, t-butyl peroxyoctoate, t-butyl peroxyneodecanoate, t-butylperoxy isobutyrate, t-amyl peroxypivalate, t-butyl peroxypivalate, di-isopropyl peroxydicarbonate, dicyclohexyl peroxydicarbonate, dicumyl peroxide, dibenzoyl peroxide, dilauroyl peroxide, potassium peroxydisulfate, ammonium peroxydisulfate, di-t-butyl hyponitrite, or dicumyl hyponitrite.

Photochemical initiator systems are chosen to have the requisite solubility in the reaction medium or monomer mixture and have an appropriate quantum yield for radical production under the conditions of the polymerization. Examples include benzoin derivatives, benzophenone, acyl phosphine oxides, and photo-redox systems.

Redox initiator systems are chosen to have the requisite solubility in the reaction medium or monomer mixture and have an appropriate rate of radical production under the conditions of the polymerization. These initiating systems may include combinations of oxidants (e.g., potassium peroxydisulfate, hydrogen peroxide, t-butyl hydro-peroxide) and reductants (e.g., iron (II), titanium (III), potassium thiosulfite, potassium bisulfite).

Other suitable initiating systems are described in recent texts. See, for example, Moad and Solomon "The Chemistry of Free Radical Polymerization", Pergamon, London, 1995, pp 53-95.

The monomers or comonomers of the monomer mix generally include one or more of acrylate and methacrylate esters, and unsaturated polycyclic fluoroalcohols, and optionally fluoro-olefins, vinyl ethers and mixtures of these monomers.

It should be understood that it is also possible, if desired, to produce polymers with broad, yet controlled, polydispersity or multimodal molecular weight distribution by controlled addition of the CTA over the course of the polymerization process of the present invention.

The invention can be used to narrow the polydispersity of polymers formed in polymerizations that would otherwise produce polymers of broad or very broad polydispersities. In this circumstance a preferred polydispersity is one which is less than that formed in the absence of the CTA.

The molecular weight and the polydispersity of the polymer made by the process of the present invention are controlled by one or more of the following:

The polymerization conditions are selected to minimize the number of chains formed from initiator-derived radicals to an extent consistent with obtaining an acceptable rate of polymerization. Termination of polymerization by radical-radical reaction will lead to chains that contain no active group and therefore cannot be reactivated. The rate of radical-radical termination is proportional to the square of the radical concentration. Furthermore, in the synthesis of block, star or branched polymers, chains formed from initiator-derived radicals will constitute a linear homopolymer impurity in the final product. These reaction conditions therefore require careful choice of the initiator concentration and, where appropriate, the rate of the initiator feed.

It is also desirable to choose other components of the polymerization medium (for example, the solvents, surfactants, additives, and initiator) such that they have a low transfer constant towards the propagating radical. Chain transfer to these species will lead to the formation of chains that do not contain the active group.

As a general guide in choosing conditions for the polymerization of narrow polydispersity polymers, the concentration of initiator(s) and other reaction conditions [solvent(s) if any, reaction temperature, reaction pressure, surfactants if any, other additives] should be chosen such that the molecular weight of polymer formed in the absence of the CTA is at least twice that formed in its presence. In polymerizations where radical-radical termination is solely by disproportionation, this equates to choosing an initiator concentration such that the total moles of initiating radicals formed during the polymerization is in the range of $10^{-6}$ times to 1.0 times that of the total moles of CTA.

Thus, by varying the ratio of the total number of moles of the CTA to the total number of moles of the free radical initiator added to a polymerization medium, the polydispersity of the resulting polymer is controlled. Thus, by decreasing the foregoing ratio, a polymer of lower polydispersity is obtained and by increasing the ratio, a polymer of higher polydispersity is obtained.

With these provisos, the polymerization process according to the present invention is performed under the conditions typical of conventional free-radical polymerization. Polymerization employing the CTAs of the present invention is suitably carried out with temperatures during the reaction in the range 30° C. to 120° C., preferably in the range 60° C. to 100° C.

The process of this invention can be carried out in emulsion, solution or suspension in either a batch, semi-batch, continuous, or feed mode. Otherwise-conventional procedures can be used to produce narrow polydispersity polymers. For lowest polydispersity polymers, the CTA is added before polymerization is commenced. For example, when carried out in batch mode in solution, the reactor is typically charged with CTA and monomer or medium plus monomer. To the mixture is then added the desired amount of initiator and the mixture is heated for a time that is dictated by the desired conversion and molecular weight.

In the case of emulsion or suspension polymerization the polymerization medium will often be predominantly water. Conventional stabilizers, dispersants and other additives can also be present.

For solution polymerization, the polymerization medium can be chosen from a wide range of media to suit the monomer(s) being used. Suitable polyermization media include aromatic hydrocarbons, such as, petroleum naphtha or xylenes; fluorocarbons, such as 1,1,1,3,3-pentafluorobutane; ketones, such as methyl amyl ketone, methyl isobutyl ketone, methyl ethyl ketone and acetone; esters, such as ethyl acetate, butyl acetate and hexyl acetate; and glycol ether esters, such as propylene glycol monomethyl ether acetate.

As has already been stated, the use of feed polymerization conditions allows the use of CTAs with lower transfer constants and allows the synthesis of polymers that are not readily achieved using batch polymerization processes. If the polymerization is carried out as a feed system the reaction can be carried out as follows. The reactor is charged with the chosen polymerization medium, the CTA and optionally a portion of the monomer mixture. Into a separate vessel is placed the remaining monomer mixture. The free radical initiator is dissolved or suspended in polymerization medium in another separate vessel. The medium in the reactor is heated and stirred while the monomer mixture+medium and initiator+medium are introduced, for example by a syringe pump or other pumping device. The rate and duration of feed is determined largely by the quantity of solution, the desired monomer/CTA/initiator ratio and the rate of the polymerization. When the feed is complete, heating may be continued for an additional period. Sequential addition of different monomers will give a block or gradient copolymer.

Preferred CTAs are dithioesters and trithiocarbonates, such as S-cyanomethyl-S-dodecyltrithiocarbonate and 4-cyano4-(dodecylsulfanylthiocarbonyl)sulfanyl pentanoic acid. The polymerization pressure can range from 0 to about 10,000 psig, preferably from about 150 to about 1,000 psig. Preferably, the monomer mixture is chosen so that the resulting polymer contains at least 40% repeat units derived from acrylate monomer(s). More preferably, the monomer mixture is chosen so that the resulting polymer contains at least 60% repeat units derived from acrylate monomer(s).

An advantage of the process of the present invention is that by successively adding different monomers to the reaction mixture, block polymers of low polydispersity and desired molecular weight can be produced.

Following completion of the polymerization, the polymer can be isolated by stripping off the medium and unreacted monomer(s) or by precipitation with a non-solvent. Alternatively, the polymer solution/emulsion can be used as such, if appropriate to its application.

The process of the present invention can be used under various reaction conditions to produce polymers having low polydispersity. By varying the rate of monomer addition or by varying the sequence in which the monomers are added to the polymerization medium, the process of the present invention can be used to produce block and multi-block and gradient polymers. By selecting the functionalities desired, an end-functional polymer of specific end functionalities can be readily produced.

Protective Groups for Removal by PAC Catalysis

The copolymers of the resist compositions of this invention can contain one or more components having protected acidic fluorinated alcohol groups (e.g., —$C(R_f)(R_f')OR_a$, where $R_a$ is not H) or other acid groups that can yield hydrophilic groups by the reaction with acids or bases generated photolytically from photoactive compounds (PACs). A given protected fluorinated alcohol group contains a protecting group that protects the fluorinated alcohol group from exhibiting its acidity while in this protected form. A given protected acid group ($R_a$) is normally chosen on the basis of its being acid-labile, such that when acid is produced upon imagewise exposure, it will catalyze deprotection of the protected acidic fluorinated alcohol groups and production of hydrophilic acid groups that are necessary for development under aqueous conditions.

An alpha-alkoxyalkyl ether group (i.e., $R_a$=$OCH_2R_b$, wherein $R_b$=$C_1$-$C_{11}$ alkyl) is a preferred protecting group for the fluoroalcohol group in order to maintain a high degree of transparency in the photoresist composition. An illustrative, but non-limiting, example of an alpha-alkoxyalkyl ether group that is effective as a protecting group is methoxy methyl ether (MOM). A protected fluoroalcohol with this particular protecting group can be obtained by reaction of chloromethylmethyl ether with the fluoroalcohol. An especially preferred protected fluoroalcohol group has the structure:

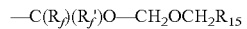

wherein, $R_f$ and $R_f'$ are the same or different fluoroalkyl groups of from 1 to 10 carbon atoms or taken together are $(CF_2)_n$ wherein n is 2 to 10; $R_{15}$ is H, a linear alkyl group of 1 to 10 carbon atoms, or a branched alkyl group of 3 to 10 carbon atoms.

Carbonates formed from a fluorinated alcohol and a tertiary aliphatic alcohol can also be used as protected acidic fluorinated alcohol groups.

The copolymers of this invention can also contain other types of protected acidic groups that yield an acidic group upon exposure to acid. Examples of such types of protected acidic groups include, but are not limited to: A) esters capable of forming, or rearranging to, a tertiary cation; B) esters of lactones; C) acetal esters; D) β-cyclic ketone esters; E) α-cyclic ether esters; and F) esters which are easily hydrolyzable because of anchimeric assistance, such as MEEMA (methoxy ethoxy ethyl methacrylate).

Some specific examples in category A) are t-butyl ester, 2-methyl-2-adamantyl ester, and isobornyl ester.

In this invention, often, but not always, the components having protected groups are repeat units having protected acid groups that have been incorporated in the base copolymer resins of the compositions (as discussed above). Frequently the protected acid groups are present in one or more comonomers that are polymerized to form a given copolymeric base resin of this invention. Alternatively, in this invention, a copolymeric base resin can be formed by copolymerization with an acid-containing comonomer and then subsequently acid functionality in the resulting acid-containing copolymer can be partially or wholly converted by appropriate means to derivatives having protected acid groups.

Photoactive Component (PAC)

The copolymers of this invention can be used to make photoresists by combining the copolymers with at least one photoactive component, a compound that affords either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG). Several suitable photoacid generators are disclosed in WO 00/66575.

Suitable photoacid generators for this invention include, but are not limited to, 1) sulfonium salts (structure III), 2) iodonium salts (structure IV), and 3) hydroxamic acid esters, such as structure V.

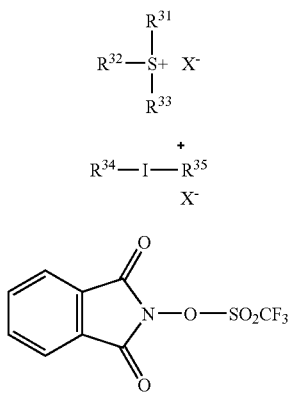

In structures III-V, $R^{31}$-$R^{35}$ are independently substituted or unsubstituted aryl or substituted or unsubstituted $C_7$-$C_{20}$ alkylaryl (aralkyl). Representative aryl groups include, but are not limited to, phenyl and naphthyl. Suitable substituents include, but are not limited to, hydroxyl (—OH) and $C_1$-$C_{20}$ alkyloxy (e.g., —$OC_{10}H_{21}$). The anion, $X^-$, in structures III-V can be, but is not limited to, $SbF_6^-$ (hexafluoroantimonate), $CF_3SO_3^-$ (trifluoromethylsulfonate=triflate), and $C_4F_9SO_3^-$ (perfluorobutylsulfonate).

Dissolution Inhibitors and Additives

Various dissolution inhibitors can be added to photoresists derived from the copolymers of this invention. Ideally, dissolution inhibitors (DIs) for far and extreme UV resists (e.g., 193 nm resists) should be designed/chosen to satisfy multiple materials needs including dissolution inhibition, plasma etch resistance, and adhesion behavior of resist compositions comprising a given DI additive. Some dissolution inhibiting compounds also serve as plasticizers in resist compositions. Several suitable dissolution inhibitors are disclosed in WO 00/66575.

Positive-Working and Negative-Working Photoresists

The photoresists of this invention can either be positive-working photoresists or negative-working photoresists, depending upon choice of components in the fluoropolymer, presence or absence of optional dissolution inhibitor and crosslinking agents, and the choice of developer (solvent used in development). In positive-working photoresists, the resist polymer becomes more soluble and/or dispersible in a solvent used in development in the imaged or irradiated areas whereas in a negative-working photoresist, the resist polymer becomes less soluble and/or dispersible in the imaged or irradiated areas. In one preferred embodiment of this invention, irradiation causes the generation of acid or base by the photoactive component discussed above. The acid or base may catalyze removal of protecting groups from the fluoroalcohol and optionally other acidic groups present in a polymer comprising a repeat unit derived from at least one ethylenically unsaturated compound containing a fluoroalcohol functional group or a protected fluoroalcohol functional group having the structure:

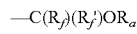

wherein $R_f$ and $R_f'$ are the same or different fluoroalkyl groups of from 1 to about 10 carbon atoms or taken together are $(CF_2)_n$ wherein n is 2 to 10 and $R_a$ is hydrogen or a protected functional group. Development in an aqueous base such a tetramethylammonium hydroxide would result in the formation of a positive image whereas development in an organic solvent or critical fluid (having moderate to low polarity), would results in a negative-working system in which exposed areas remain and unexposed areas are removed. Positive-working photoresists are preferred. A variety of different crosslinking agents can be employed as required or optional photoactive component(s) in the negative-working mode of this invention. (A crosslinking agent is required in embodiments that involve insolubilization in developer solution as a result of crosslinking, but is optional in preferred embodiments that involve insolubilization in developer solution as a result of polar groups being formed in exposed areas that are insoluble in organic solvents and critical fluids having moderate/low polarity). Suitable crosslinking agents include, but are not limited to, various bis-azides, such as 4,4'-diazidodiphenyl sulfide and 3,3'-diazidodiphenyl sulfone. Preferably, a negative-working resist composition containing a crosslinking agent also contains suitable functionality (e.g., unsaturated C═C bonds) that can react with the reactive species (e.g., nitrenes) that are generated upon exposure to UV to produce crosslinked polymers that are not soluble, dispersed, or substantially swollen in developer solution, that consequently imparts negative-working characteristics to the composition.

Other Components

Photoresists of this invention can contain additional optional components. Examples of optional components include, but are not limited to, resolution enhancers, adhesion promoters, residue reducers, coating aids, plasticizers, and $T_g$ (glass transition temperature) modifiers.

Process Steps

Imagewise Exposure

The photoresist compositions of this invention are sensitive in the ultraviolet region of the electromagnetic spectrum and especially to those wavelengths ≦365 nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, and most preferably it is done with ultraviolet light of 193 nm, 157 nm, or lower wavelengths. Imagewise exposure can either be done digitally with a laser or equivalent device or non-digitally with use of a photomask. Laser light can also be used with a photomask. Digital imaging with a laser is preferred. Suitable laser devices for digital imaging of the compositions of this invention include, but are not limited to, an argon-fluorine excimer laser with UV output at 193 nm, a krypton-fluorine excimer laser with UV output at 248 nm, and a fluorine (F2) laser with output at 157 nm. Since use of UV light of lower wavelength for imagewise exposure corresponds to higher resolution (lower resolution limit), the use of a lower wavelength (e.g., 193 nm or 157 m or lower) is generally preferred over use of a higher wavelength (e.g., 248 nm or higher).

Development

The copolymers in the resist compositions of this invention must contain sufficient functionality for development following imagewise exposure to UV light. Preferably, the functionality is acid or protected acid such that aqueous development is possible using a basic developer such as sodium hydroxide solution, potassium hydroxide solution, or ammonium hydroxide solution. Some preferred copolymers in the resist compositions of this invention are acid-containing copolymers or copolymers comprised of at least one fluoroalcohol-containing monomer of structural unit:

—C($R_f$)($R_f'$)OH wherein $R_f$ and $R_f'$ are the same or different fluoroalkyl groups of from 1 to 10 carbon atoms or taken together are $(CF_2)_n$ wherein n is 2 to 10. The level of acidic fluoroalcohol groups is determined for a given composition by optimizing the amount needed for good development in aqueous alkaline developer.

When an aqueous processable photoresist is coated or otherwise applied to a substrate and imagewise exposed to UV light, development of the photoresist composition may require that the binder material contain sufficient acid groups (e.g., fluoroalcohol groups) and/or protected acid groups that are at least partially deprotected upon exposure to render the photoresist (or other photoimageable coating composition) processable in aqueous alkaline developer. In case of a positive-working photoresist, the photoresist layer will be removed during development in portions which have been exposed to UV radiation but will be substantially unaffected in unexposed portions. Development of positive-working resists typically consists of treatment by aqueous alkaline systems, such as aqueous solutions containing 0.262 N tetramethylammonium hydroxide, at 25° C. for 2 minutes or less. In case of a negative-working photoresist, the photoresist layer will be removed during development in portions which are unexposed to UV radiation, but will be substantially unaffected in exposed portions. Development of a negative-working resist typically consists of treatment with a critical fluid or an organic solvent.

A critical fluid, as used herein, is a substance heated to a temperature near or above its critical temperature and compressed to a pressure near or above its critical pressure. Critical fluids in this invention are at a temperature that is higher than 15° C. below the critical temperature of the fluid and are at a pressure higher than 5 atmospheres below the critical pressure of the fluid. Carbon dioxide can be used for the critical fluid in the present invention. Various organic solvents can also be used as developer in this invention. These include, but are not limited to, halogenated solvents and non-halogenated solvents. Halogenated solvents are preferred and fluorinated solvents are more preferred. A critical fluid can comprise one or more chemical compounds.

Substrate

The substrate employed in this invention can illustratively be silicon, silicon oxide, silicon oxynitride, silicon nitride, or various other materials used in semiconductive manufacture.

EXAMPLES

Unless otherwise noted, all compositions are given as mole %.

| | Chemicals/Monomers |
|---|---|
| HAdA | Hydroxyadamantyl acrylate |
| MAdA | 2-Methyl-2-adamantyl acrylate (2-Propenoic acid, 2-methyltricyclo[3.3.1.13,7]dec-2-yl ester) [CAS Registry number 249562-06-9] |
| MEK | 2-Butanone Sigma-Aldrich Chemical Co., Milwaukee, WI |
| NB—F—OH |  |
| PGMEA | Propylene glycol methyl ether acetate Sigma-Aldrich Chemical Co., Milwaukee, WI |
| PinAc | 2-Propenoic acid, 2-hydroxy-1,1,2-trimethylpropyl ester [CAS Reg number 97325-36-5] |
| Solkane 365 mfc | 1,1,1,3,3-Pentafluorobutane Solvay Fluor, Hannover, Germany |
| t-BuAc | tert-Butyl acrylate Sigma-Aldrich Chemical Company, Milwaukee, WI |
| TCB | Trichlorobenzene Sigma-Aldrich Chemical Co., Milwaukee, WI |
| TFE | Tetrafluoroethylene E. I. du Pont de Nemours and Company, Wilmington, DE |
| THF | Tetrahydrofuran Sigma-Aldrich Chemical Co., Milwaukee, WI |
| Vazo ®67 | 2,2'-Azobis(2-methylbutanenitrile) [CAS Registry number 13472-08-7] E. I. du Pont de Nemours and Company, Wilmington, DE |
| Vazo ®88 | 1,1'-Azobis(cyclohexanecarbonitrile) [CAS Registry number 2094-98-6] E. I. du Pont de Nemours and Company, Wilmington, DE |

Example 1

Synthesis of a TFE, NB—F—OH, HAdA, PinAc Tetrapolymer

A metal pressure vessel of approximate 270 mL capacity was charged with 52.2 g NB—F—OH, 12.38 g PinAc, 10.66 g HAdA, 3.18 g of S-cyanomethyl-S-dodecyltrithiocarbonate and 15 mL of ethyl acetate. The vessel was closed, cooled to about −15° C., and pressurized to 400 psi with nitrogen and vented several times. The reactor contents at about atmospheric pressure were heated to 75° C. TFE was added to a total pressure of 180 psi and a pressure regulator was set to maintain the pressure at 180 psi throughout the polymerization by adding TFE as required. 100 ml of a monomer feed solution was prepared by combining 24.17 g NB—F—OH, 34.4 g PinAc and 29.6 g HAdA in ethyl acetate. The solution so prepared was pumped into the reactor at a rate of 0.10 mL/minute for 12 hr. Simultaneously, a solution of 2.89 g Vazo®67 diluted to 100 mL with ethyl acetate was pumped into the reactor at a rate of 2.0 mL/minute for 6 minutes, and then at a rate of 0.1 mL/minute for 8 hours. After 16 hours of reaction, the vessel was cooled to room temperature and vented to 1 atmosphere. The recovered polymer solution was added slowly while stirring to an excess of heptane to precipitate the polymer. The precipitate formed thereby was filtered, washed with heptane and air dried. The resulting solid was dissolved in a mixture of about 135 ml THF and 203 mL Solkane 365 mfc and added slowly to excess heptane. The precipitate so formed was filtered, washed with heptane and dried in a vacuum oven overnight to give 72.21 g of white polymer. GPC analysis showed Mn=7600, Mw=13400 and Mw/Mn=1.76. Anal. Found: C, 60.14; H, 7.76; F, 9.83. From its $^{13}$C NMR spectrum, the polymer composition was found to be 2% TFE, 20% NB—F—OH and 78% of a mixture of PinAc and HAdA.

Comparative Example A

Synthesis of a TFE, NB—F—OH, HAdA, PinAc Tetrapolymer

The procedure of example 1 was followed except that no S-cyanomethyl-S-dodecyltrithiocarbonate was added to the reactor. There was isolated 82.3 g of polymer. GPC analysis showed Mn=13600, Mw=56000 and Mw/Mn=4.12. Anal. Found: C, 58.69; H, 7.32; F, 13.28. From its $^{13}$C NMR spectrum, the polymer composition was found to be 4% TFE, 24% NB—F—OH, 48% PinAc and 24% HAdA.

Example 2

Synthesis of a TFE, NB—F—OH, HAdA, PinAc Tetrapolymer

The procedure of example 1 was followed except that the 3.18 g of S-cyanomethyl-S-dodecyltrithiocarbonate was replaced by 3.87 g of 4-cyano-4-(dodecylsulfanylthiocarbonyl)sulfanyl pentanoic acid. There was isolated 82.1 g of polymer. GPC analysis showed Mn=6700, Mw=13400, Mw/Mn=2.00. Anal. Found: C, 58.95; H, 7.78; F, 10.82.

Example 3

Synthesis of a TFE, NB—F—OH, HAdA, PinAc Tetrapolymer

The procedure of example 1 was followed except that the amount of S-cyanomethyl-S-dodecyltrithiocarbonate was increased to 4.77 g and the amount of Vazo®67 was increased to 4.40 g. There was isolated 80.5 g of polymer. GPC analysis showed Mn=6200, Mw=11100 and Mw/Mn=1.80. Anal. Found: C, 59.83; H, 7.71; F, 10.33. From its $^{13}$C NMR spectrum, the polymer composition was found to be 3% TFE, 21% NB—F—OH, 45% PinAc and 27% HAdA.

Comparative Example B

Synthesis of a TFE, NB—F—OH, HAdA, PinAcTetrapolymer

The procedure of example 3 was followed except that 14.4 g of THF was used as a chain transfer agent in place of the S-cyanomethyl-S-dodecyltrithiocarbonate. There was isolated 84.2 g of polymer. GPC analysis showed Mn=7300, Mw=26700 and Mw/Mn=3.68. Anal. Found: C, 58.43; H, 7.35; F, 13.26. From its $^{13}$C NMR spectrum, the polymer composition was found to be 5% TFE, 25% NB—F—OH, and 71% of a mixture of PinAc and HAdA.

Comparative Example C

Synthesis of a TFE, NB—F—OH, HAdA, PinAc Tetrapolymer

The procedure of Example 3 was followed except that 2.02 g of dodecanethiol was used as chain transfer agent in place of the S-cyanomethyl-S-dodecyltrithiocarbonate. There was isolated 85.3 g of polymer. GPC analysis showed Mn=7300, Mw=43200, Mw/Mn=5.93. Anal. Found: C, 57.69; H, 7.18; F, 14.68. From its $^{13}$C NMR spectrum, the polymer composition was found to be 4% TFE, 25% NB—F—OH, 44% PinAc and 27% HAdA.

Example 3 and Comparative Examples B and C illustrate the better molecular weight control (lower Mw/Mn) achieved with the trithiocarbonate chain transfer agent as compared with the more traditional ether or thiol chain transfer agents.

Example 4

Synthesis of a TFE, NB—F—OH, PinAc, MAdA, HAdA Pentapolymer

A metal pressure vessel of approximate 270 mL capacity was charged with 52.2 g NB—F—OH, 6.19 g PinAc, 2.64 g MAdA, 15.98 g HAdA, 4.77 g of S-cyanomethyl-S-dodecyltrithiocarbonate and 15 mL of ethyl acetate. The vessel was closed, cooled to about −15° C., and pressurized to 400 psi with nitrogen and vented several times. The reactor contents at about atmospheric pressure were heated to 75° C. TFE was added to a total pressure of 180 psi and a pressure regulator was set to maintain the pressure at 180 psi throughout the polymerization by adding TFE as required. 100 ml of a monomer feed solution was prepared by combining 24.17 g NB—F—OH, 17.2 g PinAc, 7.33 MAdA and 44.4 g HAdA in ethyl acetate. The solution so prepared was pumped into the reactor at a rate of 0.10 mL/minute for 12 hr. Simultaneously, a solution of 2.31 g Vazo®67 diluted to 100 mL with ethyl acetate was pumped into the reactor at a rate of 2.0 mL/minute for 6 minutes, and then at a rate of 0.1 mL/minute for 8 hours. After 16 hours of reaction, the vessel was cooled to room temperature and vented to 1 atmosphere. The recovered polymer solution was treated as described in Example 1 so as to obtain 76.0 g of white polymer. GPC analysis showed Mn=5400, Mw=9300 and Mw/Mn=1.74. Anal. Found: C, 62.94; H, 7.83; F, 8.07. A UV spectrum of the polymer obtained in methylene chloride solution showed an absorption band at 311 nm with ε=6800, confirming the presence of thiocarbonate end groups on the polymer chains. From its $^{13}$C NMR spectrum, the. polymer composition was found to be 2% TFE, 18% NB—F—OH and 80% of a mixture of PinAc, MAdA and HAdA.

Example 5

Synthesis of a TFE, NB—F—OH, PinAc, MAdA, HAdA Pentapolymer

The procedure of Example 4 was followed except that the amount of Vazo® 67 initiator was decreased to 1.45 g. There was isolated 78.8 g of polymer. GPC analysis showed Mn=4400, Mw=7800 and Mw/Mn=1.75. A UV spectrum of the polymer obtained in THF solution showed an absorption band at 311 nm with $\epsilon$=7080, confirming the presence of thiocarbonate end groups on the polymer chains. Anal. Found: C, 62.54; H, 7.74; F, 8.81.

Example 6

Synthesis of an NB—F—OH, PinAc, MAdA, HAdA Tetrapolymer

A metal pressure vessel of approximate 270 mL capacity was charged with 52.2 g NB—F—OH, 6.19 g PinAc, 2.64 g MAdA, 15.98 g HAdA, 3.18 g of S-cyanomethyl-S-dodecyl-trithiocarbonate and 15 mL of ethyl acetate. The vessel was closed, cooled to about −15° C., and pressurized to 400 psi with nitrogen and vented several times. The reactor contents at about atmospheric pressure were heated to 75° C. 100 ml of a monomer feed solution was prepared by combining 24.17 g NB—F—OH, 17.2 g PinAc, 7.33 MAdA and 44.4 g HAdA in ethyl acetate. The solution so prepared was pumped into the reactor at a rate of 0.10 mL/minute for 12 hr. Simultaneously, a solution of 2.89 g Vazo®67 diluted to 100 mL with ethyl acetate was pumped into the reactor at a rate of 2.0 mL/minute for 6 minutes, and then at a rate of 0.1 mL/minute for 8 hours. After 16 hours of reaction, the vessel was cooled to room temperature and vented to 1 atmosphere. The recovered polymer solution was treated as described in example 1 so as to obtain 74.1 g of white polymer. GPC analysis showed Mn=6300, Mw=11500 and Mw/Mn=1.82. Anal. Found: C, 62.68; H, 7.84; F, 8.51. From its $^{13}$C NMR spectrum, the polymer composition was found to be 21% NB—F—OH and 79% of a mixture of PinAc, MAdA and HAdA.

Comparative Example D

Synthesis of an NB—F—OH, PinAc, MAdA, HAdA Tetrapolymer

The procedure of Example 6 was followed except that no S-cyanomethyl-S-dodecyltrithiocarbonate was added to the reactor. There was isolated 81.1 g of polymer. GPC analysis showed Mn=14,900; Mw=96,200; and Mw/Mn=6.46. Anal. Found: C, 61.11; H, 7.45; F, 13.12. From its $^{13}$C NMR spectrum, the polymer composition was found to be 28% NB—F—OH and 72% of a mixture of PinAc, MAdA, and HAdA.

Example 7

Synthesis of a TFE, NB—F—OH, PinAc, MAdA and HAdA Pentapolymer

A metal pressure vessel of approximate 270 mL capacity was charged with 52.2 g NB—F—OH, 6.19 g PinAc, 2.64 g MAdA, 15.98 g HAdA, 3.18 g of S-cyanomethyl-S-dodecyl-trithiocarbonate and 15 mL of ethyl acetate. The vessel was closed, cooled to about −15° C., and pressurized to 400 psi with nitrogen and vented several times. The reactor contents at about atmospheric pressure were heated to 75° C. TFE was added to a total pressure of 180 psi and a pressure regulator was set to maintain the pressure at 180 psi throughout the polymerization by adding TFE as required. 100 ml of a monomer feed solution was prepared by combining 24.17 g NB—F—OH, 17.2 g PinAc, 7.33 MAdA and 44.4 g HAdA in ethyl acetate. The solution so prepared was pumped into the reactor at a rate of 0.10 mL/minute for 12 hr. Simultaneously, a solution of 2.89 g Vazo®67 diluted to 100 mL with ethyl acetate was pumped into the reactor at a rate of 2.0 mL/minute for 6 minutes, and then at a rate of 0.1 mL/minute for 8 hours. After 16 hours of reaction, the vessel was cooled to room temperature and vented to 1 atmosphere. The recovered polymer solution was treated as described in Example 1 so as to obtain 78.6 g of white polymer. GPC analysis showed Mn=6800, Mw=13400 and Mw/Mn=1.97. Anal. Found: C, 62.66; H, 7.75; F, 9.29. From its $^{13}$C NMR spectrum, the polymer composition was found to be 3% TFE, 20% NB—F—OH, and 77% of a mixture of PinAc, MAdA and HAdA.

Example 8

Synthesis of a TFE, NB—F—OH, PinAc, MAdA and HAdA Pentapolymer

A metal pressure vessel of approximate 270 mL capacity was charged with 71.34 g NB—F—OH, 3.10 g PinAc, 1.98 g MAdA, 5.99 g HAdA, 3.18 g of S-cyanomethyl-S-dodecyl-trithiocarbonate and 15 mL of ethyl acetate. The vessel was closed, cooled to about −15° C., and pressurized to 400 psi with nitrogen and vented several times. The reactor contents at about atmospheric pressure were heated to 75° C. TFE was added to a total pressure of 240 psi and a pressure regulator was set to maintain the pressure at 240 psi throughout the polymerization by adding TFE as required. 100 ml of a monomer feed solution was prepared by combining 41.08 g NB—F—OH, 15.77 9 PinAc, 10.08 MAdA and 30.53 9 HAdA in ethyl acetate. The solution so prepared was pumped into the reactor at a rate of 0.10 mL/minute for 12 hr. Simultaneously, a solution of 2.89 g Vazo@67 diluted to 100 mL with ethyl acetate was pumped into the reactor at a rate of 2.0 mL/minute for 6 minutes, and then at a rate of 0.1 mL/minute for 8 hours. After 16 hours of reaction, the vessel was cooled to room temperature and vented to 1 atmosphere. The recovered polymer solution was treated as described in Example 1 so as to obtain 52.2 g of white polymer. GPC analysis showed Mn=5100, Mw=10100 and Mw/Mn=1.98. Anal. Found: C, 61.02; H, 7.47; F, 12.07. From its $^{13}$C NMR spectrum, the polymer composition was found to be 3% TFE, 23% NB—F—OH, and 73% of a mixture of PinAc, MAdA and HAdA.

Comparative Example E

Synthesis of a TFE, NB—F—OH, PinAc, MAdA and HAdA Pentapolymer

The procedure of Example 8 was followed except that no S-cyanomethyl-S-dodecyltrithiocarbonate was added to the reactor. There was isolated 69.9 g of polymer. GPC analysis showed Mn=7400, Mw=18300 and Mw/Mn=2.48. Anal. Found: C, 57.73; H, 6.84; F, 17.68. From its $^{13}$C NMR spectrum, the polymer composition was found to be 6% TFE, 32% NB—F—OH, and 63% of a mixture of PinAc, MAdA and HAdA.

Example 9

The following solution was prepared and magnetically stirred overnight.

| Component | Wt. (gm) |
|---|---|
| TFE/NB—F—OH/HAdA/PinAc polymer | |
| in Example 1 | 2.940 |
| 2-Heptanone | 20.460 |
| Solution of tetrabutylammonium lactate in 2-heptanone prepared as follows: | |
| 2.5 g of aqueous tetrabutylammonium hydroxide (40%, Sigma-Aldrich) was dissolved in 97.5 g ethyl lactate (Sigma-Aldrich). 9.5 g of this solution was later dissolved in 9.5 g of 2-heptanone. | 0.72 |
| 6.82% (wt) solution of triphenylsulfonium nonaflate dissolved in 2-heptanone which had been filtered through a 0.45 μm PTFE syringe filter. | 0.880 |

The wafer was prepared by applying an HMDS (hexamethyldisilazane) primer layer using a YES-3 vapor prime oven. A 100% HMDS adhesion promoter from Arch Chemical Co. was used. The oven was programmed to give a prime at 150-300° C. for 160 sec.

The sample was spin-coated using a Brewer Science Inc. Model-100CB combination spin coater/hotplate on a 4 in. diameter Type "P", <100> orientation, silicon wafer. To prepare the coating, 2 ml of the above solution, after filtering through a 0.45 μm PTFE syringe filter, was deposited and spun at 2500 rpm for 60 sec and then baked at 150° C. for 60 sec.

Imaging at 248 nm was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 30 sec, providing an unattenuated dose of 45 mJ/cm². By using a mask with 18 positions of varying neutral optical density, a wide variety of exposure doses were generated. After exposure the exposed wafer was baked at 150° C. for 60 sec.

Development was performed on a Litho Tech Japan Co. Resist Development Analyzer (Model 790). The wafer was developed for 60 sec in aqueous tetramethylammonium hydroxide (TMAH) solution (Shipley LDD-026w, 2.38% TMAH solution).

This test generated a positive image with a clearing dose of approximately 15.7 mJ/cm².

Example 10

A solution was prepared and magnetically stirred overnight as described for Example 9, except in this case the TFE/NB—F—OH/PinAc/MAdA/HAdA polymer in Example 7 was substituted for the TFE/NB—F—OH/HAdA/PinAc polymer in Example 1.

The wafer was prepared and processed as in Example 9. This test generated a positive image with a clearing dose of 13.5 mJ/cm².

We claim:

1. A low polydispersity copolymer comprising:
    a. a repeat unit derived from an acrylic monomer selected from the group consisting of MAdA, HAdA, PinAc, PinMAc, and $CH_2=C(CH_2OH)CO_2R'''$, wherein R''' is a $C_1$-$C_{25}$ alkyl group, optionally substituted by one or more hydroxy, halogen, ether oxygen, ester or ketone carbonyl groups;
    b. a repeat unit derived from an unsaturated polycyclic monomer; and
    c. a functional group selected from the group of fluoroalcohol, protected fluoroalcohol and protected acid group;
    wherein at least 40 mole % of the repeat units of the low polydispersity copolymer are derived from acrylic monomers and the polydispersity is 1.05-2.0.

2. The low polydispersity copolymer of claim 1, wherein the repeat unit derived from an unsaturated polycyclic monomer comprises a fluoroalcohol functional group or a protected fluoroalcohol functional group.

3. The low polydispersity copolymer of claim 1, wherein the repeat unit derived from an unsaturated polycyclic monomer comprises a fluoroalcohol functional group, -$X_r(CH_2)_qC(R_f)(R_f')OH$, or a protected fluoroalcohol group functional group, -$X_r(CH_2)_qC(R_f)(R_f')OR_a$, wherein
    $R_f$ and $R_f'$ are the same or different fluoroalkyl groups of from 1 to 10 carbon atoms, or taken together are $(CF_2)_n$;
    n is an integer from 2 to 10;
    X is selected from the group consisting of S, O, N, and P; and q=0 and r=0, or q=1 and r=0 or 1.

4. The low polydispersity copolymer of claim 1, wherein the unsaturated polycyclic monomer is NB-F-OH.

5. The low polydispersity copolymer of claim 1, further comprising a fluoro-olefin.

6. The low polydispersity copolymer of claim 1, wherein the fluoro-olefin is tetrafluoroethylene.

7. The low polydispersity copolymer of claim 1, wherein the unsaturated polycyclic monomer is selected from the group consisting of (H) and (I),

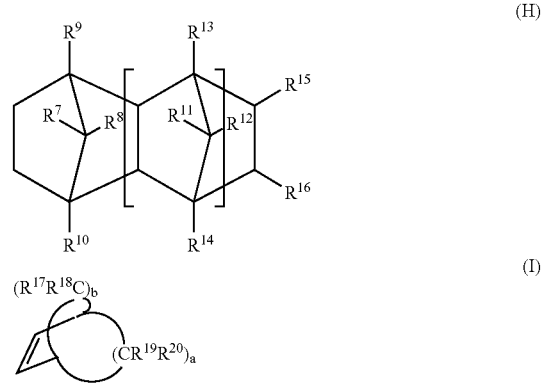

wherein:
    s is 0, 1 or 2;
    a and b are independently 1, 2 or 3, except that a is not 1 when b is 2 or vice versa; and
    $R^7$ to $R^{16}$ and $R^{17}$ to $R^{20}$ are the same or different and each represents a hydrogen atom, a halogen atom, a carboxyl group, a $C_3$ to $C_{14}$ secondary or tertiary alkyl carboxylate, a hydrocarbon group or a substituted hydrocarbon group.

8. The low polydispersity copolymer of claim 1, wherein the unsaturated polycyclic monomer is represented by structure I:

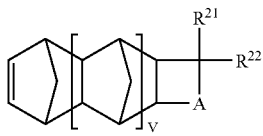

(I)

v is 0, 1, or 2;
A is O (oxygen) or $NR^{27}$;
$R^{27}$ is selected from the group of H; $C_1$-$C_{10}$ alkyl or alkoxy, optionally substituted by halogen or ether oxygens; $C_6$-$C_{20}$ aryl; Y; $C(R_f)(R_f')OR^{28}$; $R^{29}Y$; and $OR^{29}Y$;
$R^{28}$ is a $C_1$-$C_{10}$ alkyl group;
$R^{29}$ is a $C_1$-$C_{20}$ alkylene group, optionally substituted by halogen or ether oxygen;
Y is COZ' or $SO_2Z'$;
Z' is OH, halogen, $R^{30}$ or $OR^{30}$;
$R^{30}$ is a $C_1$-$C_{20}$ alkyl group, optionally substituted by halogen or ether oxygens; or $C_6$-$C_{20}$ aryl;
$R_f$ and $R_f'$ are the same or different fluoroalkyl groups of 1 to 10 carbon atoms or taken together are $(CF_2)_n$ where n is 2 to 10; and
$R^{21}$ and $R^{22}$ are independently selected from the group of H; halogen; $C_1$-$C_{10}$ alkyl or alkoxy, optionally substituted by halogen or ether oxygen; $C_6$-$C_{20}$ aryl; Y; $C(R_f)(R_f')OR^{28}$; $R^{29}Y$; and $OR^{29}Y$; or
$R^{21}$ and $R^{22}$ taken together are $=C(R_f)(R_f')$ or $C_2$-$C_9$ alkylene, optionally substituted by halogen or incorporating an ether oxygen.

9. The low polydispersity copolymer of claim 1, wherein the unsaturated polycyclic monomer is represented by structure II:

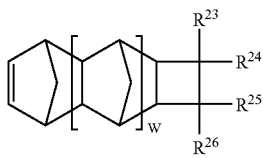

(II)

w is 0, 1, or 2;
$R^{23}$, $R^{24}$ and $R^{25}$ are independently selected from the group of H; halogen; $C_1$-$C_{10}$ alkyl or alkoxy, optionally substituted by halogen or ether oxygen; $C_6$-$C_{20}$ aryl; Y; $C(R_f)(R_f')OR^{28}$; $R^{29}Y$; and $OR^{29}Y$; or
$R^{24}$ and $R^{25}$ taken together are part of a double bond;
$R^{26}$ is hydrogen or an acid-labile protecting group;
$R^{28}$ is a $C_1$-$C_{10}$ alkyl group;
$R^{29}$ is a $C_1$-$C_{20}$ alkylene group, optionally substituted by halogen or ether oxygen;
Y is COZ' or $SO_2Z'$;
Z' is OH, halogen, $R^{30}$ or $OR^{30}$;
$R^{30}$ is a $C_1$-$C_{20}$ alkyl group, optionally substituted by halogen or ether oxygens; or $C_6$-$C_{20}$ aryl; and
$R_f$ and $R_f'$ are the same or different fluoroalkyl groups of 1 to 10 carbon atoms or taken together are $(CF_2)_p$ where n is 2 to 10.

10. A low polydispersity copolymer comprising:
a. a repeat unit derived from an acrylic monomer;
b. a repeat unit derived from an unsaturated polycyclic monomer wherein the unsaturated polycyclic monomer is represented by structure I or structure II, wherein structure I is

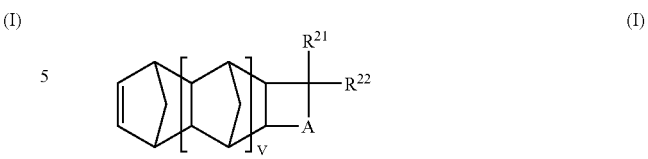

(I)

wherein
v is 0, 1, or 2;
A is O (oxygen) or $NR^{27}$;
$R^{27}$ is selected from the group of H; $C_1$-$C_{10}$ alkyl or alkoxy, optionally substituted by halogen or ether oxygens; $C_6$-$C_{20}$ aryl; Y; $C(R_f)(R_f')OR^{28}$; $R^{29}Y$; and $OR^{29}Y$;
$R^{28}$ is a $C_1$-$C_{10}$ alkyl group;
$R^{29}$ is a $C_1$-$C_{20}$ alkylene group, optionally substituted by halogen or ether oxygen;
Y is COZ' or $SO_2Z'$;
Z' is OH, halogen, $R^{30}$ or $OR^{30}$;
$R^{30}$ is a $C_1$-$C_{20}$ alkyl group, optionally substituted by halogen or ether oxygens; or $C_6$-$C_{20}$ aryl;
$R_f$ and $R_f'$ are the same or different fluoroalkyl groups of 1 to 10 carbon atoms or taken together are $(CF_2)_n$ where n is 2 to 10; and
$R^{21}$ and $R^{22}$ are independently selected from the group of H; halogen; $C_1$-$C_{10}$ alkyl or alkoxy, optionally substituted by halogen or ether oxygen; $C_6$-$C_{20}$ aryl; Y; $C(R_f)(R_f')OR^{28}$; $R^{29}Y$; and $OR^{29}Y$; or
$R^{21}$ and $R^{22}$ taken together are $=C(R_f)(R_f')$ or $C_2$-$C_9$ alkylene, optionally substituted by halogen or incorporating an ether oxygen; and
structure II is:

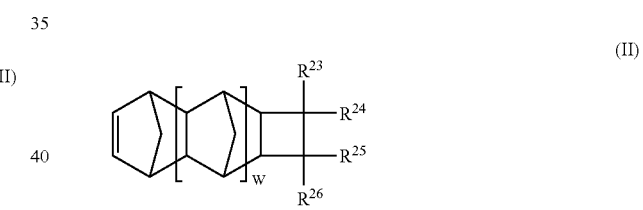

(II)

w is 0, 1, or 2;
$R^{23}$, $R^{24}$ and $R^{25}$ are independently selected from the group of H; halogen; $C_1$-$C_{10}$ alkyl or alkoxy, optionally substituted by halogen or ether oxygen; $C_6$-$C_{20}$ aryl; Y; $C(R_f)(R_f')OR^{28}$; $R^{29}Y$; and $OR^{29}Y$; or
$R^{24}$ and $R^{25}$ taken together are part of a double bond;
$R^{26}$ is hydrogen or an acid-labile protecting group;
$R^{28}$ is a $C_1$-$C_{10}$ alkyl group;
$R^{29}$ is a $C_1$-$C_{20}$ alkylene group, optionally substituted by halogen or ether oxygen;
Y is COZ' or $SO_2Z'$;
Z' is OH, halogen, $R^{30}$ or $OR^{30}$;
$R^{30}$ is a $C_1$-$C_{20}$ alkyl group, optionally substituted by halogen or ether oxygens; or $C_6$-$C_{20}$ aryl; and
$R_f$ and $R_f'$ are the same or different fluoroalkyl groups of 1 to 10 carbon atoms or taken together are $(CF_2)_n$ where n is 2 to 10; and
c. a functional group selected from the group of fluoroalcohol, protected fluoroalcohol and protected acid group; wherein at least 40 mole% of the repeat units of the low polydispersity copolymer are derived from acrylic monomers and the polydispersity is 1.05-2.0.

11. The low polydispersity copolymer of claim 10, wherein the acrylic monomer is $CH_2=CR'CO_2R''$;

R' is H, F, an alkyl group of 1 to 5 carbon atoms, or a fluoroalkyl group of 1 to 5 carbon atoms;

R" is a $C_1$-$C_{20}$ acyclic aliphatic group; a polycyclic $C_5$-$C_{50}$ alkyl group, optionally containing at least one hydroxy functional group; or a functional group of the formula: —C(R$^1$)(R$^2$)—[C(R$^3$)(R$^4$)]$_m$—C(R$^5$)(R$^6$)—OH;

m=0, 1, 2, 3, 4 or 5;

$R^1$ and $R^2$ are independently $C_1$-$C_6$ alkyl; $C_1$-$C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;

$R^3$ and $R^4$ are independently H, $C_1$-$C_6$ alkyl; $C_1$-$C_6$ alkyl substituted with an ether oxygen; or $R^3$ and $R^4$ taken together form a 3- to 8-membered ring, optionally substituted with an ether oxygen;

$R^5$ and $R^6$ are independently H, $C_1$-$C_6$ alkyl; $C_1$-$C_6$ alkyl substituted with an ether oxygen; or $R^5$ and $R^6$ taken together form a 3- to 8-membered ring, optionally substituted with an ether oxygen; or $R^1$ and $R^5$ taken together with —[C(R$^3$)(R$^4$)]$_m$— form a 4- to 8-membered ring, provided that the carbon attached to $R^1$ and $R^2$ is not at a bridgehead position.

12. The low polydispersity copolymer of claim 10, further comprising a fluoro-olefin.

13. The low polydispersity copolymer of claim 12, wherein the fluoro-olefin is tetrafluoroethylene.

14. A photoresist comprising:
a. a photoactive component; and
b. a low polydispersity copolymer comprising:
  a repeat unit derived from an acrylic monomer selected from the group consisting of MAdA, HAdA, PinAc, PinMAc, and CH$_2$=C(CH$_2$OH)CO$_2$R'", wherein R'" is a $C_1$-$C_{25}$ alkyl group. optionally substituted by one or more hydroxy, halogen, ether oxygen, ester or ketone carbonyl groups;
  ii. a repeat unit derived from an unsaturated polycyclic monomer; and
  iii. a functional group selected from the group of fluoroalcohol, protected fluoroalcohol, and protected acid groups;
wherein at least 40 mole% of the repeat units of the low polydispersity copolymer are derived from acrylic monomers and the polydispersity is 1.05-2.0.

15. The photoresist of claim 14, wherein the low-polydispersity copolymer further comprises a fluoro-olefin.

16. The photoresist of claim 15, wherein the fluoro-olefin is tetrafluoroethylene.

17. A photoresist comprising:
a. a photoactive component; and
b. a low polydispersity copolymer comprising:
  i. a repeat unit derived from an acrylic monomer;
  ii. a repeat unit derived from an unsaturated polycyclic monomer wherein the unsaturated polycyclic monomer is represented by structure I or structure II, wherein structure I is

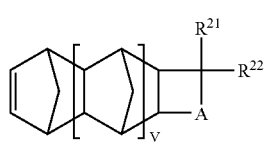
(I)

wherein
v is 0, 1, or 2;
A is O (oxygen) or NR$^{27}$;
$R^{27}$ is selected from the group of H; $C_1$-$C_{10}$ alkyl or alkoxy, optionally substituted by halogen or ether oxygens; $C_6$-$C_{20}$ aryl; Y; C(R$_f$)(R$_f'$)OR$^{28}$; R$^{29}$Y; and OR$^{29}$Y;
$R^{28}$ is a $C_1$-$C_{10}$ alkyl group;
$R^{29}$ is a $C_1$-$C_{20}$ alkylene group, optionally substituted by halogen or ether oxygen;
Y is COZ' or SO$_2$Z';
Z' is OH, halogen, R$^{30}$ or OR$^{30}$;
$R^{30}$ is a $C_1$-$C_{20}$ alkyl group, optionally substituted by halogen or ether oxygens; or $C_6$-$C_{20}$ aryl;
$R_f$ and $R_f'$ are the same or different fluoroalkyl groups of 1 to 10 carbon atoms or taken together are (CF$_2$)$_n$ where n is 2 to 10; and
$R^{21}$ and $R^{22}$ are independently selected from the group of H; halogen; $C_1$-$C_{10}$ alkyl or alkoxy, optionally substituted by halogen or ether oxygen; $C_6$-$C_{20}$ aryl; Y; C(R$_f$)(R$_f'$)OR$^{28}$; R$^{29}$Y; and OR$^{29}$Y; or $R^{21}$ and $R^{22}$ taken together are =C(R$_f$)(R$_f'$) or $C_2$-$C_9$ alkylene, optionally substituted by halogen or incorporating an ether oxygen; and structure II is:

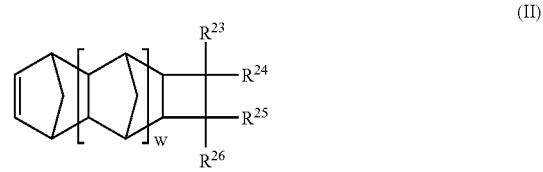
(II)

w is 0, 1, or 2;
$R^{23}$, $R^{24}$ and $R^{25}$ are independently selected from the group of H; halogen; $C_1$-$C_{10}$ alkyl or alkoxy, optionally substituted by halogen or ether oxygen; $C_6$-$C_{20}$ aryl; Y; C(R$_f$)(R$_f'$)OR$^{28}$; R$^{29}$Y; and OR$^{29}$Y; or
$R^{24}$ and $R^{25}$ taken together are part of a double bond;
$R^{26}$ is hydrogen or an acid-labile protecting group;
$R^{28}$ is a $C_1$-$C_{10}$ alkyl group;
$R^{29}$ is a $C_1$-$C_{20}$ alkylene group, optionally substituted by halogen or ether oxygen;
Y is COZ' or SO$_2$Z';
Z' is OH, halogen, R$^{30}$ or OR$^{30}$;
$R^{30}$ is a $C_1$-$C_{20}$ alkyl group, optionally substituted by halogen or ether oxygens; or $C_6$-$C_{20}$ aryl; and
$R_f$ and $R_f'$ are the same or different fluoroalkyl groups of 1 to 10 carbon atoms or taken together are (CF$_2$)$_n$ where n is 2 to 10; and
  iii. a functional group selected from the group of fluoroalcohol, protected fluoroalcohol, and protected acid groups;
wherein at least 40 mole% of the repeat units of the low polydispersity copolymer are derived from acrylic monomers and the polydispersity is 1.05-2.0.

18. The photoresist of claim 17, wherein the low-polydispersity copolymer further comprises a fluoro-olefin.

19. The photoresist of claim 18, wherein the fluoro-olefin is tetrafluoroethylene.

20. A process for forming a coated substrate, comprising:
A. coating a substrate with a mixture comprising:
  1. a low-polydispersity polymer of claim 1 or 10,
  2. a photoactive component, and
  3. a solvent; and
B. evaporating the solvent.

21. The process of claim 20, wherein low polydispersity copolymer further comprises a fluoro-olefin.

22. The process of claim 21, wherein the fluoro-olefin is tetrafluoroethylene.

23. A process for forming a photoresist image on a substrate, comprising:
  A. forming a photoresist layer on a substrate, wherein the photoresist comprises:
    1. a photoactive component, and
    2. a low polydispersity copolymer of claim 1 or 10;
  B. imagewise exposing the photoresist layer to actinic radiation to form imaged and non-imaged areas; and
  C. developing the exposed photoresist layer having imaged and non-imaged areas to form the photoresist image on the substrate.

24. The process of claim 23 wherein the low polydispersity copolymer further comprises a fluoro-olefin.

25. The process of claim 24, wherein the fluoro-olefin is tetrafluoroethylene.

26. A process for producing a low polydispersity polymer of claim 1 or 10, comprising polymerizing a monomer mix comprising at least one acrylic monomer, and at least one unsaturated polycyclic monomer, wherein at least one monomer contains a fluoroalcohol, protected fluoroalcohol or protected acid group, in the presence of a source of free radicals and a chain transfer agent to produce a copolymer containing at least 40 mole% repeat units derived from acrylic monomers, wherein the chain transfer agent has a transfer constant in the range of from 0.1 to 5000 and the chain transfer agent has the following structure:

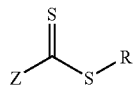

wherein:
R=alkyl, alkenyl, aryl, aralkyl, substituted alkyl, substituted aryl, carbocyclic or heterocyclic ring, alkylthio, alkoxy, or dialkylamino; and
Z=H, alkyl, aryl, aralkyl, substituted alkyl, substituted aryl, carbocyclic or heterocyclic ring, alkylthio, arylthio, alkoxycarbonyl, aryloxycarbonyl, carboxy, acyloxy, carbamoyl, cyano, dialkyl- or diaryl-phosphonato, or dialkyl- or diaryl-phosphinato.

27. The process of claim 26, wherein the monomer mix further comprises a fluoro-olefin.

28. The process of claim 27, wherein the fluoro-olefin is tetrafluoroethylene.

29. The process of claim 26, wherein Z is alkylthio.

30. The process of claim 26, wherein the chain transfer agent is S-cyanomethyl-S-dodecyltrithiocarbonate or 4-cyano-4(dodecylsulfanylthiocarbonyl)sulfanyl pentanoic acid.

31. The process of claim 26, wherein the acrylic monomer is selected from the group consisting of MAdA, HAdA, PinAc and PinMAc.

32. The process of claim 26, wherein the unsaturated polycyclic monomer is selected from the group consisting of:

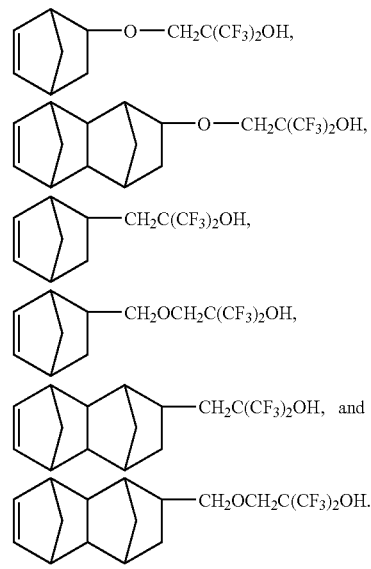

33. The process of claim 26, wherein the unsaturated polycyclic monomer is NB-F-OH.

* * * * *

UNITED STATES PATENT AND TRADEMARK OFFICE
CERTIFICATE OF CORRECTION

PATENT NO. : 7,408,013 B2
APPLICATION NO. : 10/945124
DATED : August 5, 2008
INVENTOR(S) : Andrew Edward Feiring et al.

It is certified that error appears in the above-identified patent and that said Letters Patent is hereby corrected as shown below:

Title Page -

Item (73) Assignee, please amend to read as follows:

-- Commonwealth Scientific and Industrial Research Organization, Campbell, (AU) --

Signed and Sealed this

Sixteenth Day of December, 2008

JON W. DUDAS
*Director of the United States Patent and Trademark Office*